United States Patent
Ichimura

(10) Patent No.: US 11,640,926 B2
(45) Date of Patent: May 2, 2023

(54) SEMICONDUCTOR DEVICE MANUFACTURING METHOD AND SEMICONDUCTOR DEVICE

(71) Applicant: FUJI ELECTRIC CO., LTD., Kawasaki (JP)

(72) Inventor: Yuji Ichimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 455 days.

(21) Appl. No.: 16/667,243

(22) Filed: Oct. 29, 2019

(65) Prior Publication Data

US 2020/0185291 A1 Jun. 11, 2020

(30) Foreign Application Priority Data

Dec. 7, 2018 (JP) .............................. JP2018-229625

(51) Int. Cl.
*H01L 23/24* (2006.01)
*H01L 23/08* (2006.01)
(Continued)

(52) U.S. Cl.
CPC .......... *H01L 23/24* (2013.01); *H01L 21/4817* (2013.01); *H01L 21/52* (2013.01);
(Continued)

(58) Field of Classification Search
CPC ..... H01L 23/24; H01L 21/4817; H01L 21/52; H01L 21/565; H01L 23/057; H01L 23/08; H01L 23/3675; H01L 24/48; H01L 25/16; H01L 2224/48091; H01L 2224/48137; H01L 2224/48177; H01L 2924/1203;
(Continued)

(56) References Cited

U.S. PATENT DOCUMENTS 6,608,334 B1 * 8/2003 Ishinaga ........... B29C 45/14655
257/100
2015/0294919 A1 * 10/2015 Notsu ................. H01L 23/3735
257/76
(Continued)

FOREIGN PATENT DOCUMENTS

JP 2000-077602 A 3/2000
JP 2004-022922 A 1/2004
(Continued)

OTHER PUBLICATIONS

Japanese Patent Office Action dated Oct. 4, 2022 for corresponding JP Patent Application No. 2018-229625.

*Primary Examiner* — Shahed Ahmed
*Assistant Examiner* — Sun Mi Kim King
(74) *Attorney, Agent, or Firm* — Rabin & Berdo, P.C.

(57) ABSTRACT

A semiconductor device includes a semiconductor chip, a substrate having a main surface on which the semiconductor chip is arranged, a resin case which has a storage space therein and a side wall, the side wall having an injection path extending from the storage space to a device exterior, the resin case having a first opening at a bottom side thereof, connecting the storage space to the device exterior, the substrate being disposed on the resin case, at a main surface side of the substrate facing at the bottom side of the resin case, and a sealing material filling the storage space and the injection path.

7 Claims, 9 Drawing Sheets

(51) Int. Cl.
*H01L 23/057* (2006.01)
*H01L 21/48* (2006.01)
*H01L 21/52* (2006.01)
*H01L 21/56* (2006.01)
*H01L 23/367* (2006.01)
*H01L 23/00* (2006.01)
*H01L 25/16* (2023.01)

(52) U.S. Cl.
CPC .......... *H01L 21/565* (2013.01); *H01L 23/057* (2013.01); *H01L 23/08* (2013.01); *H01L 23/3675* (2013.01); *H01L 24/48* (2013.01); *H01L 25/16* (2013.01); *H01L 2224/48091* (2013.01); *H01L 2224/48137* (2013.01); *H01L 2224/48177* (2013.01); *H01L 2924/1203* (2013.01); *H01L 2924/13055* (2013.01); *H01L 2924/13091* (2013.01); *H01L 2924/14* (2013.01)

(58) Field of Classification Search
CPC . H01L 2924/13055; H01L 2924/13091; H01L 2924/14; H01L 25/162; H01L 23/3735; H01L 24/29; H01L 24/32; H01L 24/49; H01L 25/072; H01L 2224/32227; H01L 2224/32245; H01L 2224/48105; H01L 2224/48227; H01L 2224/48247; H01L 2224/49171; H01L 2224/73265; H01L 23/047; H01L 23/564; H01L 23/045; H01L 23/10; H01L 23/16–26
See application file for complete search history.

(56) References Cited

U.S. PATENT DOCUMENTS

2017/0047280 A1 2/2017 Tanaka et al.
2019/0206752 A1* 7/2019 Bautista, Jr. ............ H01L 33/56

FOREIGN PATENT DOCUMENTS

| JP | 2004-031495 A | 1/2004 |
| JP | 2004-111435 A | 4/2004 |
| JP | 2014082233 A | 5/2014 |
| JP | 2017038019 A | 2/2017 |

* cited by examiner

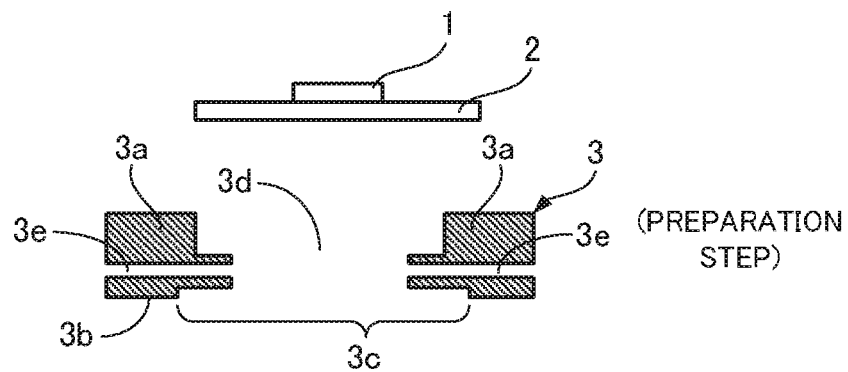
FIG. 1A (PREPARATION STEP)
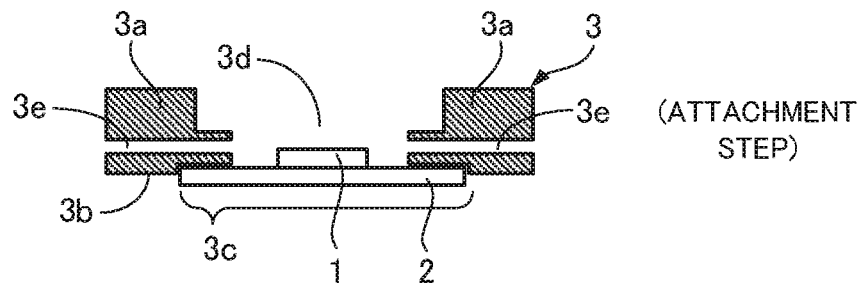
FIG. 1B (ATTACHMENT STEP)
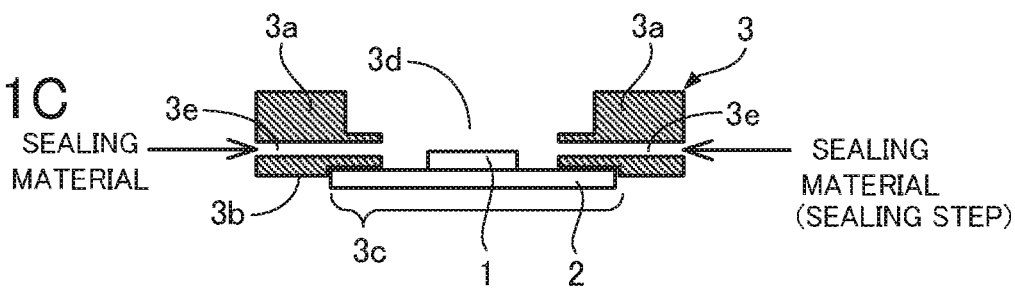
FIG. 1C (SEALING STEP)
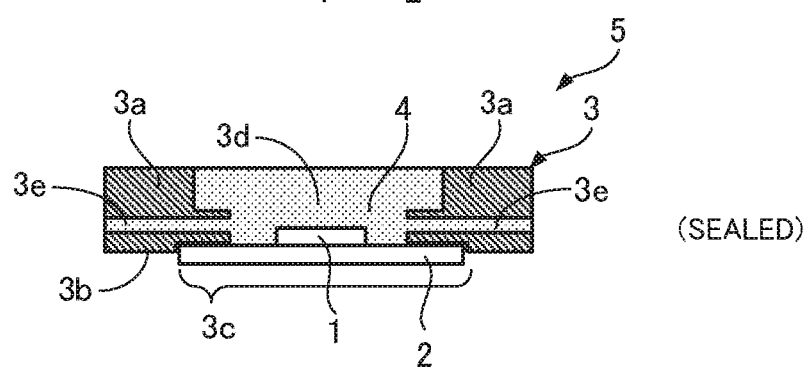
FIG. 1D (SEALED)
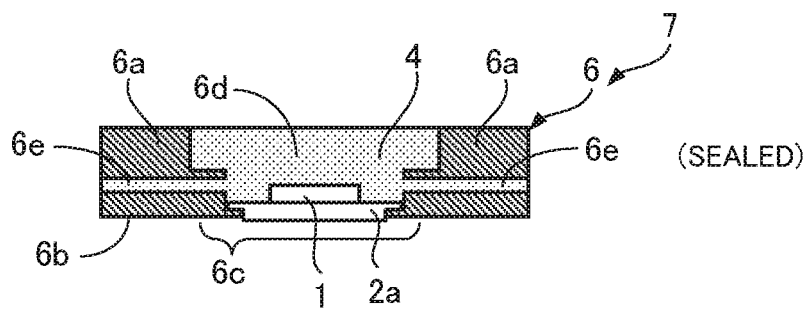
FIG. 1E (SEALED)

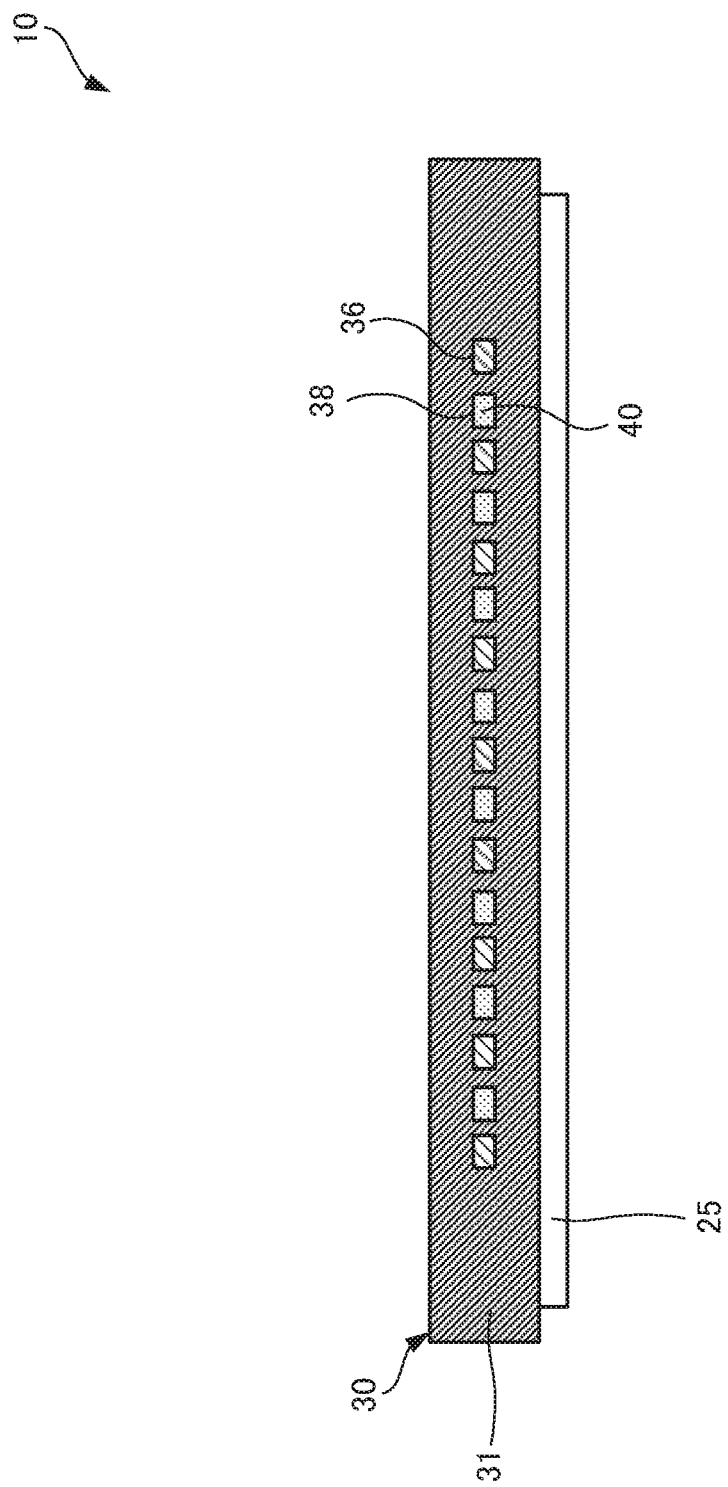

US 11,640,926 B2

SEMICONDUCTOR DEVICE MANUFACTURING METHOD AND SEMICONDUCTOR DEVICE

CROSS-REFERENCE TO RELATED APPLICATION

This application is based upon and claims the benefit of priority of the prior Japanese Patent Application No. 2018-229625, filed on Dec. 7, 2018, the entire contents of which are incorporated herein by reference.

BACKGROUND OF THE INVENTION

1. Field of the Invention

The embodiments discussed herein are related to a semiconductor device manufacturing method and a semiconductor device.

2. Background of the Related Art

Semiconductor devices include semiconductor elements such as insulated gate bipolar transistors (IGBTs) or power metal-oxide-semiconductor field-effect transistors (power MOSFETs) and are used as power conversion devices, for example.

Such a semiconductor device is formed by arranging lead terminals, etc. in storage space of a terminal case by insert molding, storing a circuit substrate on which semiconductor chips, electronic components, etc. are arranged in the storage space, and sealing the circuit substrate with sealing material by using transfer molding. Examples of the sealing material used in this sealing include epoxy resin.

Japanese Laid-open Patent Publication No. 2004-111435

An apparatus that performs transfer molding needs a large-scale and precise mold, resulting in increased manufacturing costs. In particular, gate portions of the mold that serve as ports supplying the sealing material are precise and easy to deteriorate. Thus, the mold of such an apparatus has a short life-span. Therefore, since maintenance is frequently needed for the apparatus, the costs for maintenance and management are increased.

SUMMARY

According to one aspect of the embodiments, there is provided a semiconductor device manufacturing method including: preparing a substrate having a main surface on which a semiconductor chip is disposed, and a resin case having a storage space therein, and a side wall, the side wall of the resin case having an injection path extending from the storage space to a device exterior, the resin case having a first opening at a bottom side thereof, connecting the storage space to the device exterior, attaching the substrate at a main surface side to the resin case at the bottom side so as to store the semiconductor chip in the storage space, and injecting a sealing material into the storage space via the injection path to seal the storage space.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A to 1E illustrate semiconductor device manufacturing methods according to a first embodiment;

FIG. 5 is another sectional view of the semiconductor device according to the second embodiment;

DETAILED DESCRIPTION OF THE INVENTION

Figure 2:
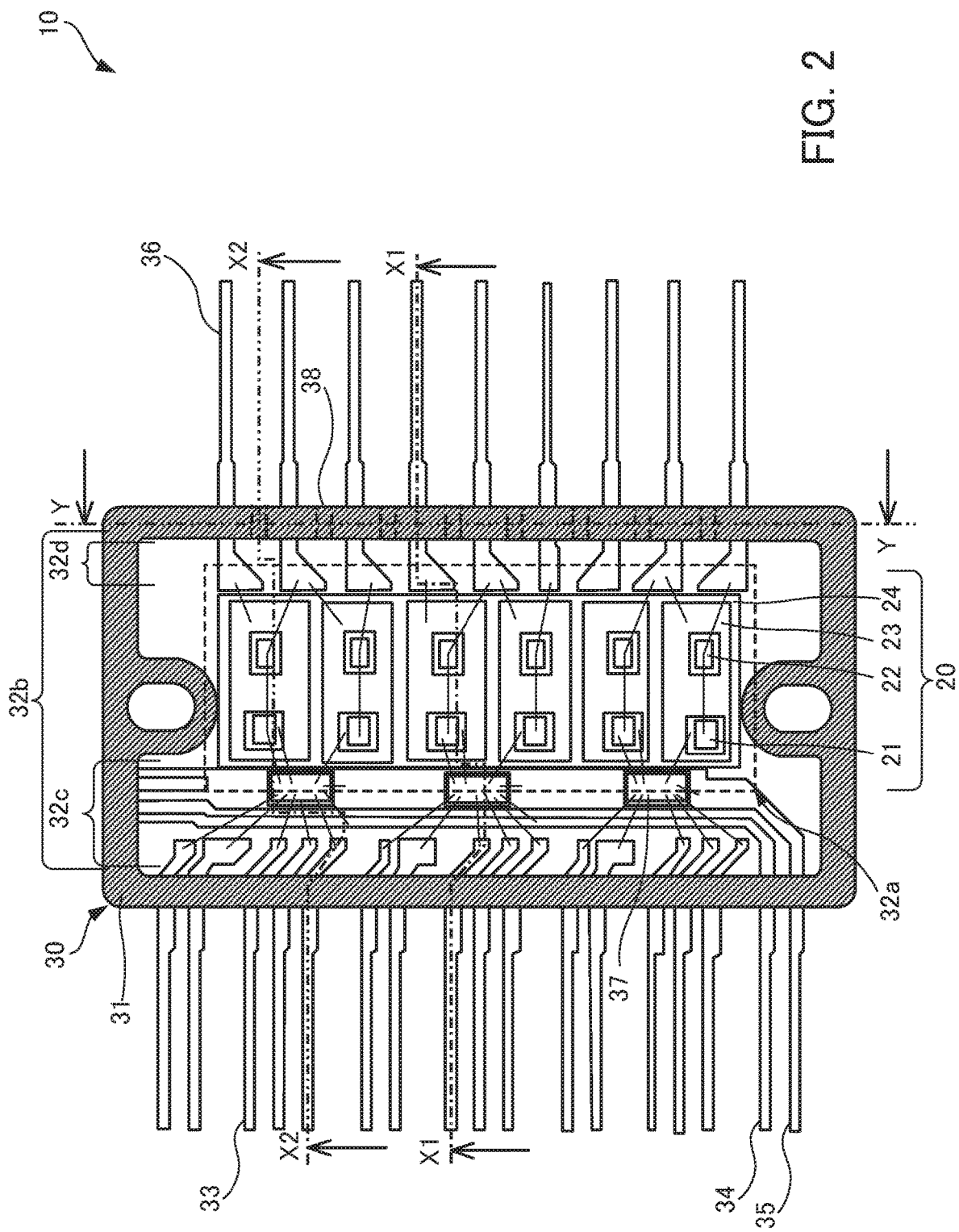
FIG. 2 is a plan view of a semiconductor device according to a second embodiment.

Hereinafter, embodiments will be described with reference to the accompanying drawings. In the following description, terms "front surface" and "top surface" each mean a surface facing upwards regarding semiconductor devices 5 and 7 in FIGS. 1D and 1E and a semiconductor device 10 in FIGS. 3 and 4. Likewise, a term "up" means an upward direction regarding the semiconductor devices 5 and 7 in FIGS. 1D and 1E and the semiconductor device 10 in FIGS. 3 and 4. In addition, terms "back surface" and "bottom surface" each mean a surface facing downwards regarding the semiconductor devices 5 and 7 in FIGS. 1D and 1E and the semiconductor device 10 in FIGS. 3 and 4. Likewise, a term "down" means a downward direction regarding the semiconductor devices 5 and 7 in FIGS. 1D and 1E and the semiconductor device 10 in FIGS. 3 and 4. In the drawings other than FIGS. 1D, 1E, 3 and 4, the above terms mean their respective directions. Thus, FIG. 2 illustrates the front surface of the semiconductor device 10. In addition, a term "side surface" means a surface perpendicular to the plane of the front surface in FIG. 2. The terms "front surface", "top surface", "up", "back surface", "bottom surface", "down", and "side surface" are only expressions used for the purpose of convenience to determine a relative positional relationship and do not limit the technical concept of the embodiments. For example, the terms "up" and "down" do not necessarily mean a vertical direction with respect to the ground. Namely, the direction indicated by "up" and "down" is not limited to the direction of gravitational force.

In addition, in the following description, a relative angular relationship between two elements could be expressed by using terms "parallel" and "perpendicular". The term "parallel" is not necessarily limited to only cases where the angle made by two elements is 0°. The term "parallel" will be used when the angle made by two elements is −15° or more and +15° or less. In addition, the term "perpendicular" is not necessarily limited to only cases where the angle made by

First Embodiment

A semiconductor device according to a first embodiment will be described with reference to FIGS. 1A to 1E. FIGS. 1A to 1E illustrate semiconductor device manufacturing methods according to the first embodiment. Specifically, FIGS. 1A to 1C illustrate steps included in a semiconductor device manufacturing method. FIGS. 1D and 1E illustrate semiconductor devices manufactured by such steps.

First, a semiconductor device 5 illustrated in FIG. 1D will be described. The semiconductor device 5 includes a semiconductor chip 1, a substrate 2 having a main surface on which the semiconductor chip 1 is arranged, a resin case 3, and sealing material 4. The resin case 3 includes a body 3a surrounding storage space 3d in which the semiconductor chip 1 is stored. The body 3a may be a frame-like body having the storage space 3d extending vertically through the resin case 3. The body 3a has side walls having injection paths 3e extending from the storage space 3d to external space. The body 3a also has a bottom surface 3b having a first opening 3c extending from the storage space 3d to the external space. The substrate 2 is arranged in the first opening 3c in the resin case 3, and the first opening 3c is covered by the substrate 2. The storage space 3d and the injection paths 3e of the resin case 3 are filled with and sealed by the sealing material 4. In addition, the resin case 3 has a top surface opposite the bottom surface 3b, and the top surface has second opening extending from the storage space 3d to the external space. The second opening is filled with the sealing material 4, and the storage space 3d and the injection paths 3e of the resin case 3 is sealed by the sealing material 4.

To manufacture this semiconductor device 5, first, the substrate 2 having the main surface on which the semiconductor chip 1 is arranged and the resin case 3 are prepared in a preparation step illustrated in FIG. 1A. The resin case 3 includes the body 3a surrounding the storage space 3d. The body 3a has the side walls having the injection paths 3e extending from the storage space 3d to the external space. In addition, the body 3a has the bottom surface 3b having the first opening 3c extending from the storage space 3d to the external space. A substrate bonding region having steps to which the substrate 2 is subsequently attached is formed around the first opening 3c. In addition, the second opening may be formed in the top surface opposite the bottom surface 3b of the resin case 3, the second opening extending from the storage space 3d to the external space.

Next, in an attachment step illustrated in FIG. 1B, the substrate 2 having the main surface on which the semiconductor chip 1 is arranged is attached to the substrate bonding region of the resin case 3. The substrate 2 may be attached to the steps arranged in the substrate bonding region via adhesive agent (not illustrated). The first opening 3c in the resin case 3 is covered by the substrate 2. This attachment step is performed in such a manner that the front surface of the substrate 2 on which the semiconductor chip 1 is arranged faces upwards in the resin case 3. Consequently, the semiconductor chip 1 is stored in the storage space 3d in the resin case 3.

Next, softened sealing material is injected via the injection paths 3e in a sealing step illustrated in FIG. 1C. In this step, the second opening in the resin case 3 may be covered by a mold (not illustrated). The injection paths 3e may be gates via which the sealing material is injected into the storage space 3d. The number of injection paths 3e is not limited to any particular number. Use of a plurality of injection paths 3e makes it easier to control the flow of the sealing material. Alternatively, the injection paths 3e may be air vents via which gas is discharged from the storage space 3d. For example, in FIG. 1C, while the sealing material is injected from the injection paths 3e on both sides of the resin case 3, the injection paths 3e on one long side may be used as gates, namely, as the sealing material injection paths, and the injection paths 3e on the other long side facing the one long side may be used as air vents, namely, as the gas discharge paths. In this way, the storage space 3d is filled with and sealed by the sealing material. Consequently, the semiconductor device 5 illustrated in FIG. 1D is manufactured.

In the manufacturing method of the semiconductor device 5, the body 3a of the resin case 3 surrounds the storage space 3d in which the semiconductor chip 1 is stored. In addition, the body 3a has side walls having the injection paths 3e extending from the storage space 3d to the external space. In addition, the semiconductor chip 1 is stored in the storage space 3d by attaching the substrate 2 in the first opening 3c of the resin case 3. Next, softened sealing material is simply injected via the injection paths 3e. Consequently, the storage space 3d and the injection paths 3e are sealed by the sealing material 4. Thus, since the kind of the sealing material 4 is not limited to any particular kind and since a large-scale and precise mold having gates is not needed to achieve sealing, reduction of the manufacturing cost is achieved. For example, even if tablet resin made of epoxy resin having high moisture resistance is used as the sealing material 4, since there is no need to perform transfer molding using a large-scale and precise mold having gates, the semiconductor device 5 having high moisture resistance is obtained easily with less manufacturing cost.

In addition, as described above, since the kind of the sealing material 4 in the semiconductor device 5 manufactured in the above way is not limited to any particular kind, properties such as the moisture resistance are improved depending on the sealing material 4. In addition, the sealing material 4 in the semiconductor device 5 seals not only the storage space 3d but also the injection paths 3e. Thus, the sealing material 4 firmly seals the semiconductor device 5.

The present embodiment is not limited to the above semiconductor device 5. The present embodiment is applicable to any semiconductor device, as long as the body 3a of the resin case 3 surrounds the storage space 3d in which the semiconductor chip 1 is stored, and the body 3a has side walls having the injection paths 3e extending from the storage space 3d to the external space. For example, the semiconductor device 7 illustrated in FIG. 1E includes a semiconductor chip 1 and a substrate 2a having a main surface on which the semiconductor chip 1 is arranged. In addition, the semiconductor device 7 includes a resin case 6 having a body 6a surrounding storage space 6d in which the semiconductor chip 1 is stored. The body 6a has side walls having injection paths 6e extending from the storage space 6d to the external space and has a bottom surface 6b having a first opening 6c extending from the storage space 6d to the external space. In addition, the sealing material 4 seals the storage space 6d and the injection paths 6e of the resin case 6. In the attachment step of the manufacturing method of the semiconductor device 7, the substrate 2a is attached in the first opening 6c from the top surface of the body 6a through the storage space 6d. The substrate 2a may be attached to steps arranged in a substrate bonding region via adhesive two elements is 90°. The term "perpendicular" will be used when the angle made by two elements is 75° or more and 105° or less.

agent (not illustrated). The first opening 6c in the resin case 6 is covered by the substrate 2a. In this step, the substrate 2a is attached in such a manner that the front surface of the substrate 2a on which the semiconductor chip 1 is arranged faces upwards in the resin case 6. Next, as in the sealing step in FIG. 1C, softened sealing material is injected via the injection paths 6e, to seal the storage space 6d. With this manufacturing method of the semiconductor device 7 and the semiconductor device 7, the same advantageous effects as described above are obtained.

Second Embodiment

Figure 3:
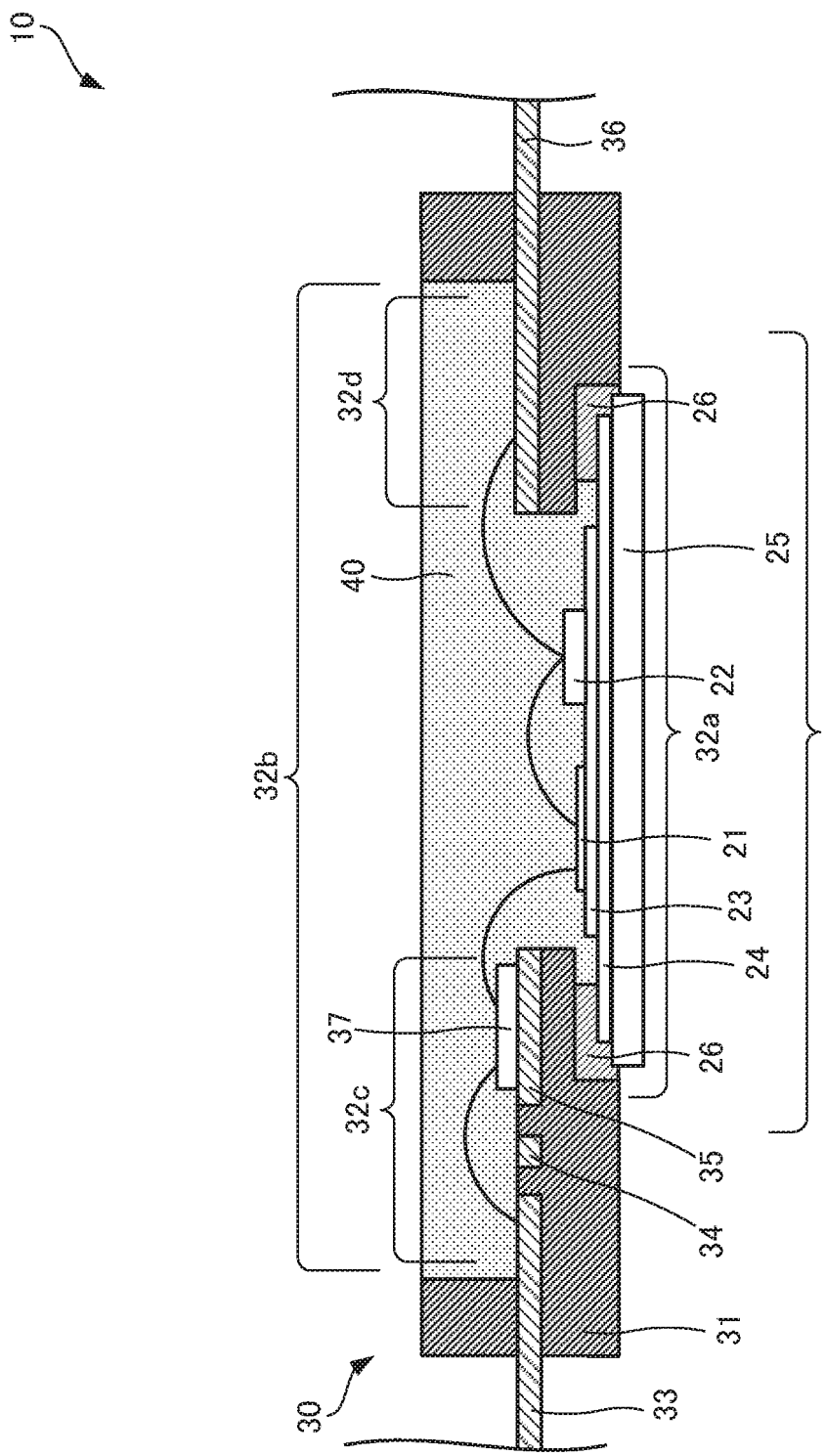
FIG. 3 is a sectional view of the semiconductor device according to the second embodiment.
Figure 4:
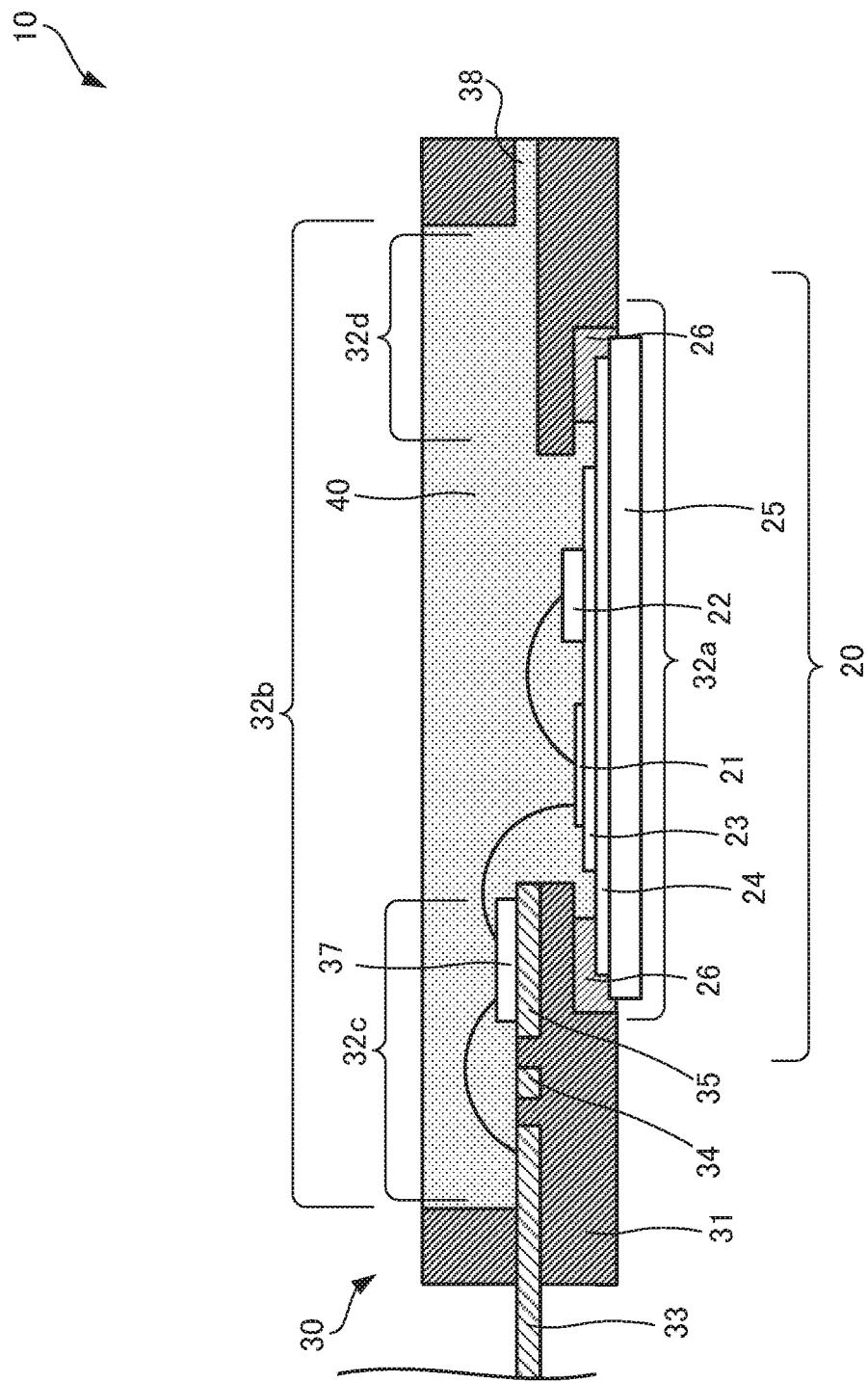
FIG. 4 is another sectional view of the semiconductor device according to the second embodiment.

In a second embodiment, the first embodiment will be described in more detail. A semiconductor device according to the second embodiment will be described with reference to FIGS. 2 to 5. FIG. 2 is a plan view of the semiconductor device according to the second embodiment. FIGS. 3 to 5 are sectional views of the semiconductor device according to the second embodiment. In FIG. 2, the sealing material is not illustrated. FIG. 3 is a sectional view taken along an alternate long and short dash line X1-X1 in FIG. 2. FIG. 4 is a sectional view taken along an alternate long and short dash line X2-X2 in FIG. 2. FIG. 5 is a sectional view taken along an alternate long and short dash line Y-Y in FIG. 2.

As illustrated in FIGS. 2 to 4, a semiconductor device 10 includes a semiconductor unit 20 and a resin case 30 in which the semiconductor unit 20 is stored. The semiconductor unit 20 includes six pairs of first semiconductor chip 21 and second semiconductor chip 22. In addition, the semiconductor unit 20 includes six circuit patterns 23, and a pair of first semiconductor chip 21 and second semiconductor chip 22 is arranged on a front surface of each of the six circuit patterns 23. The semiconductor unit 20 also includes an insulating substrate 24 having a front surface on which the circuit patterns 23 are arranged and a heat radiation plate 25 having a front surface on which the insulating substrate 24 is arranged. Regarding the semiconductor unit 20, an individual pair of first semiconductor chip 21 and second semiconductor chip 22 and an individual circuit pattern 23 having a front surface, on which a pair of first semiconductor chip 21 and second semiconductor chip 22 is arranged, are arranged as a set on the insulating substrate 24, and for example, six sets of these elements are arranged in parallel to a long side of the insulating substrate 24 on the insulating substrate 24. In the second embodiment, when there are a plurality of elements of the same kind, only one of the elements will be described as a representative example for the purpose of convenience, unless otherwise noted.

For example, a first semiconductor chip 21 includes a switching element such as an IGBT or a power MOSFET. When the first semiconductor chip 21 includes an IGBT, the first semiconductor chip 21 includes a collector electrode as a main electrode on its back surface and a gate electrode and an emitter electrode as a main electrode on its front surface. When the first semiconductor chip 21 includes a power MOSFET, the first semiconductor chip 21 includes a drain electrode as a main electrode on its back surface and a gate electrode and a source electrode as a main electrode on its front surface. The back surfaces of the above first semiconductor chips 21 are bonded to the respective circuit patterns 23 via solder (not illustrated).

For example, a second semiconductor chip 22 includes a diode such as a Schottky barrier diode (SBD) or a freewheeling diode (FWD). This second semiconductor chip 22 includes an output electrode (cathode electrode) as a main electrode on its back surface and an input electrode (anode electrode) as a main electrode on its front surface. The back surfaces of the above second semiconductor chips 22 are bonded to the respective circuit patterns 23 via solder (not illustrated).

The circuit patterns 23 are made of metal such as copper or a copper alloy having excellent electrical conductivity. In addition, for example, material such as nickel may be formed on the surface of the heat radiation plate 25 by plate processing or the like, to improve the corrosion resistance. Specifically, other than nickel, a nickel-phosphorus alloy, a nickel-boron alloy, or the like may be formed. The shape of the individual circuit pattern 23 is only an example. These circuit patterns 23 are generated by etching conductive plate or foil formed on one surface of the insulating substrate 24 or by bonding a conductive plate to one surface of the insulating substrate 24. Each of the individual circuit patterns 23 preferably has a thickness of 0.10 mm or more and 1.00 mm or less, more preferably, 0.20 mm or more and 0.50 mm or less.

The insulating substrate 24 may be formed as an organic insulating layer by combining insulating resin such as epoxy or liquid crystal polymer having low thermal resistance and aluminum oxide or silicon oxide having high thermal conductivity. Alternatively, the insulating substrate 24 may be formed as an inorganic insulating layer by using ceramic material having high thermal conductivity such as aluminum oxide, aluminum nitride, or silicon nitride having excellent thermal conductivity.

For example, the heat radiation plate 25 is made of aluminum, iron, silver, copper, or an alloy containing at least one kind of these elements having excellent thermal conductivity. In addition, for example, material such as nickel may be formed on the surface of the heat radiation plate 25 by plate processing or the like, to improve the corrosion resistance. Specifically, other than nickel, a nickel-phosphorus alloy, a nickel-boron alloy, or the like may be formed. The heat radiation performance may be improved by attaching a cooler (not illustrated) to the back surface of the heat radiation plate 25 via solder, silver solder, or the like. In this case, the cooler is made of, for example, aluminum, iron, silver, copper, or an alloy containing at least one kind of these elements having excellent thermal conductivity. In addition, a fin, a heatsink including a plurality of fins, a water-cooling cooling device, or the like may be used as the cooler. The heat radiation plate 25 may be formed integrally with the cooler. In this case, the heat radiation plate 25 is made of aluminum, iron, silver, copper, or an alloy containing at least one kind of these elements having excellent thermal conductivity. In addition, for example, material such as nickel may be formed on the surface of the heat radiation plate 25 integrally formed with the cooler by plate processing or the like, to improve the corrosion resistance of the heat radiation plate 25. Specifically, other than nickel, a nickel-phosphorus alloy, a nickel-boron alloy, or the like may be formed.

Regarding the combination of the circuit patterns 23, the insulating substrate 24, and the heat radiation plate 25, Direct Copper Bond (DCB) substrate or an Active Metal Brazed (AMB) substrate, which is obtained by bonding copper foil on both surfaces of an inorganic insulating layer such as aluminum oxide, aluminum nitride, or silicon nitride, may be used.

Next, the resin case 30 will be described. The resin case 30 includes a frame body 31, which is a frame-like body, lead terminals 33 to 36 that are external connection terminals arranged on the frame body 31, and control integrated circuits (ICs) 37. The frame body 31 includes storage space 32b in which the semiconductor unit 20 is stored, a storage opening part 32a in the bottom surface of the frame body 31, and a plurality of gates 38 on a side surface of the frame body 31. The frame body 31 may include a storage opening part in the top surface of the frame body 31. In FIG. 2, the location of the storage opening part 32a is indicated by a dashed line. The frame body 31 is made of thermoplastic resin such as polyphenylenesulfide (PPS), polybutyleneterephthalate (PBT) resin, polybutylene succinate (PBS) resin, polyamide (PA) resin, and acrylonitrile butadiene styrene (ABS) resin.

The storage opening part 32a is an opening region in the bottom surface of the frame body 31. Steps are formed around the periphery of the storage opening part 32a. The front surface of the semiconductor unit 20 is attached to the steps around the storage opening part 32a with adhesive agent 26. The storage opening part 32a is covered by the semiconductor unit 20, and the storage space 32b is sealed off by the semiconductor unit 20. The storage space 32b is space that is extending from the storage opening part 32a to the external space and that is surrounded by the frame body 31. Steps are arranged along long sides inside the storage space 32b of the frame body 31, and a first lead region 32c and a second lead region 32d are set on surfaces of the steps.

The plurality of lead terminals 33 are arranged in a line on one long side of the frame body 31 and integrated with the frame body 31. One end of an individual lead terminal 33 juts out into the external space from the one long side of the frame body 31, and the other end appears in the first lead region 32c in the storage space 32b. In addition, the lead terminals 34 and 35 are also arranged in a line with the plurality of lead terminals 33 on the one long side of the frame body 31 and integrated with the frame body 31. One end of each of the lead terminals 34 and 35 juts out into the external space from the one long side of the frame body 31, and the other end appears and is wired in the first lead region 32c in the storage space 32b. The control ICs 37 are arranged on the lead terminal 35 in the first lead region 32c via solder (not illustrated). To realize desired functions, in place of the control ICs 37, for example, electronic components such as thermistors, capacitors, or resistors may be used as needed. In addition, the plurality of lead terminals 36 are arranged in a line on the other long side of the frame body 31 facing the above one long side of the frame body 31 and integrated with the frame body 31. One end of each of the lead terminals 36 juts out into the external space from the other long side of the frame body 31, and the other end appears in the second lead region 32d in the storage space 32b. In the semiconductor unit 20 stored in the resin case 30 in this way, the first semiconductor chips 21, the second semiconductor chips 22, the lead terminals 33 to 36, and the control ICs 37 are electrically connected via wiring members such as wires (whose reference characters are omitted) as needed. Consequently, a desired circuit is configured in the semiconductor device 10.

The plurality of gates 38 are formed on the other long side of the frame body 31. Namely, as illustrated in FIGS. 4 and 5, the gates 38 are formed in a line with the lead terminals 36. The gates 38 and the lead terminals 36 may be formed alternately in a line. Alternatively, the lead terminals 36 and the gates 38 may be formed vertically on the side surface of the frame body 31. The gates 38 and the lead terminals 36 may have the same cross-sectional shape. Each gate 38 extends from the storage space 32b to the external space of the frame body 31. The storage space 32b and each gate 38 of the resin case 30 in which the semiconductor unit 20 is attached are filled with and sealed by sealing material 40.

Figure 6A:
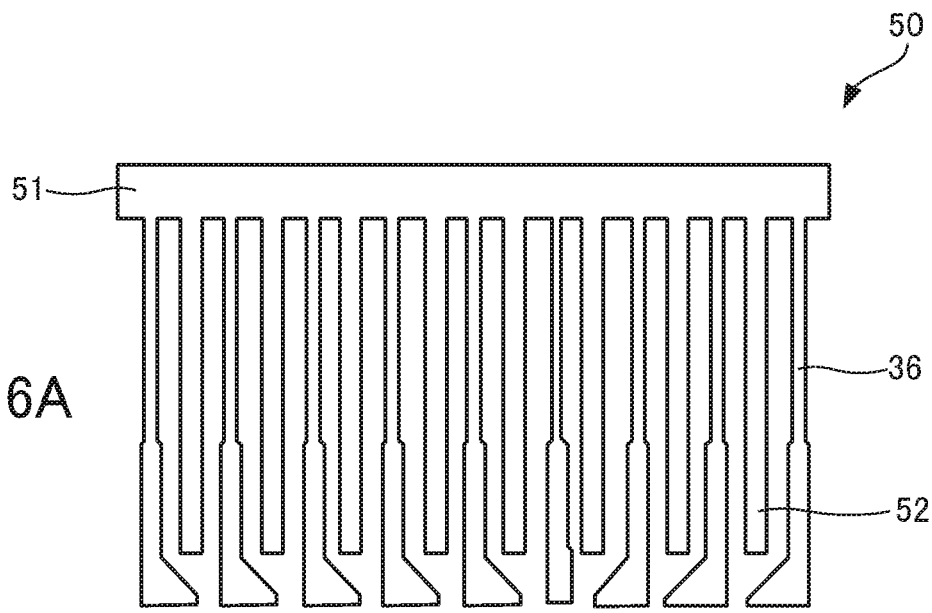
FIGS. 6A to 6C are first to third diagrams illustrating a manufacturing method of a resin case included in the semiconductor device according to the second embodiment.
Figure 6B:
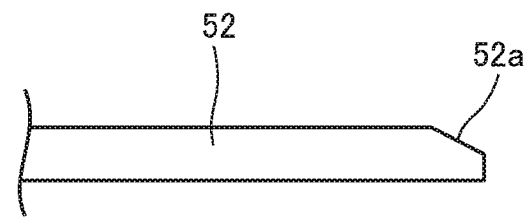
Figure 6C:
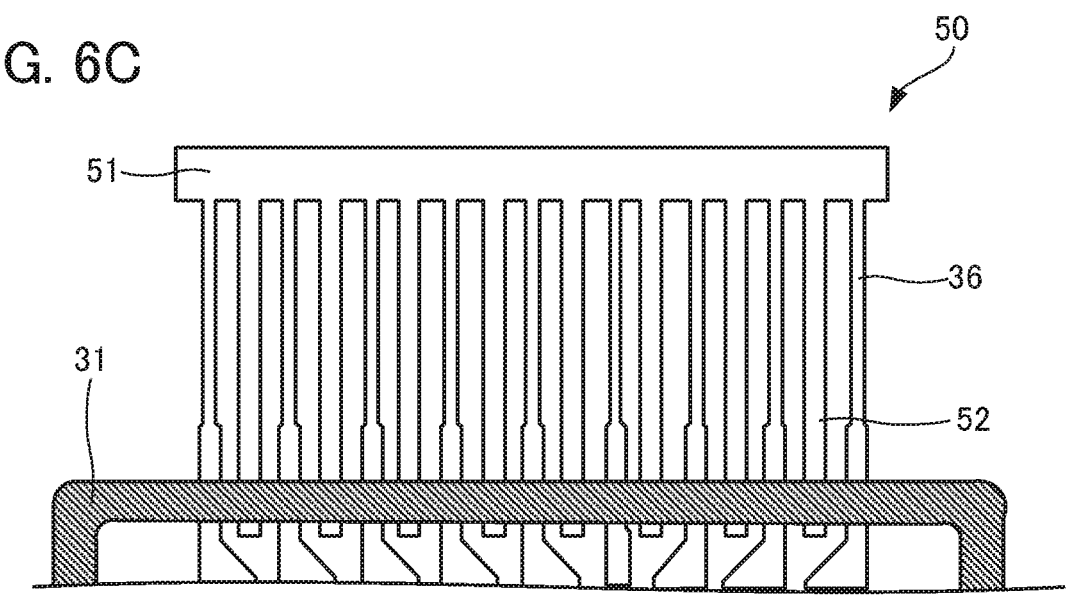
Figure 7A:
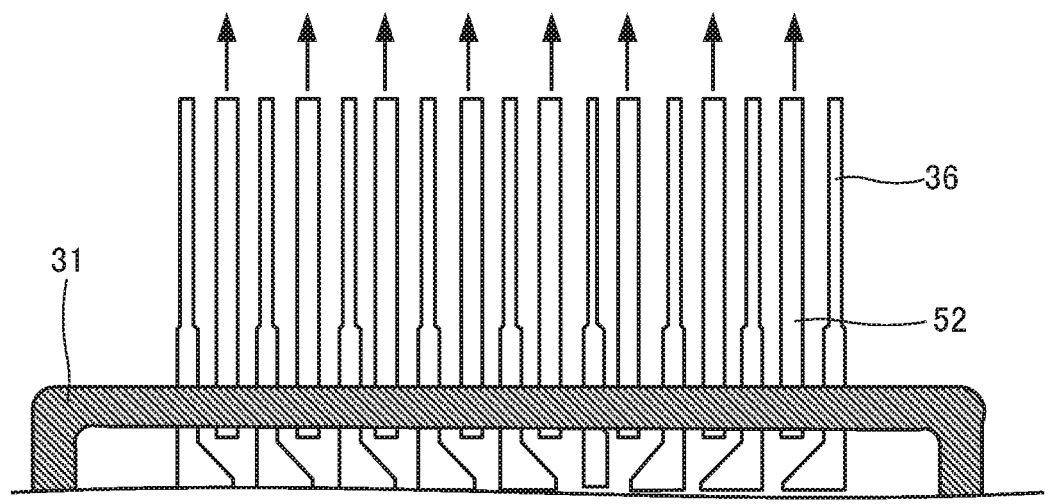
FIGS. 7A and 7B are fourth and fifth diagrams illustrating the manufacturing method of the resin case included in the semiconductor device according to the second embodiment.
Figure 7B:
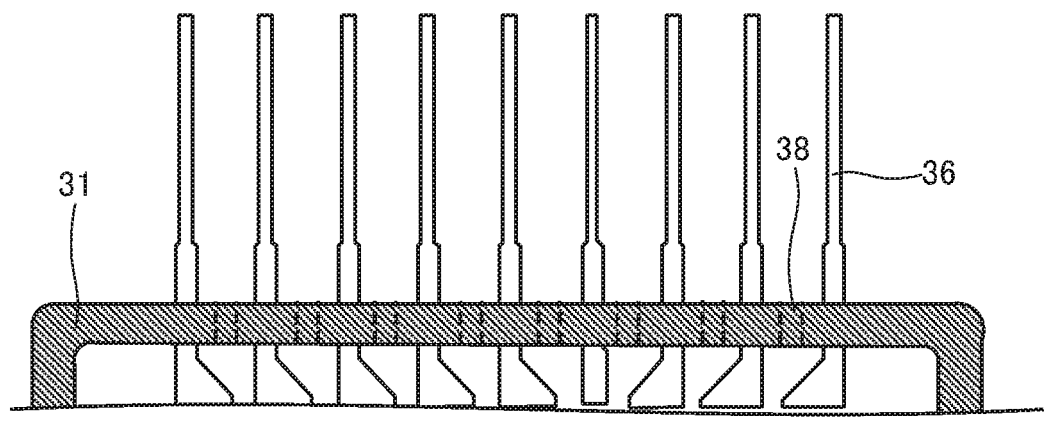

Next, a manufacturing method of the semiconductor device 10 will be described. First, a manufacturing method of the resin case 30 will be described with reference to FIGS. 6A to 6C and FIGS. 7A and 7B. FIGS. 6A to 6C and FIGS. 7A and 7B illustrate a manufacturing method of the resin case included in the semiconductor device according to the second embodiment. FIG. 6A illustrates a lead part 50 including the lead terminals 36, and FIG. 6B is a side view of an individual molding member 52 included in the lead part 50. FIG. 6C illustrates the lead part 50 inserted into the frame body 31. FIG. 7A illustrates removal of the molding members 52, and FIG. 7B illustrates the frame body 31 from which the molding members 52 have been removed.

First, the lead part 50 illustrated in FIG. 6A is prepared. The plurality of lead terminals 36, the plurality of molding members 52, and a linkage member 51 are integrated to form the lead part 50. Namely, the lead terminals 36 and the molding members 52 of the lead part 50 are arranged in a line, and ends thereof are linked and connected to the linkage member 51. This lead part 50 is made of aluminum, iron, silver, copper, or an alloy containing at least one kind of these elements having excellent electrical conductivity. In addition, for example, metal such as nickel or gold may be formed on the surface of the lead part 50 by plate processing or the like, to improve the corrosion resistance. Specifically, other than nickel or gold, a nickel-phosphorus alloy, a nickel-boron alloy, or the like may be formed. Gold may additionally be accumulated on a nickel-phosphorus alloy. It is preferable that mold release agent such as silicone be applied to at least the surface of the region of the molding member 52, the region being integrated with the frame body 31.

The lead part 50 is obtained by stamping on a plate made of the above material by using a precision mold. Instead of stamping, etching based on chemical corrosion may be applied. The lead terminals 36 and the molding members 52 may have a rod-like cylindrical or columnar shape. As illustrated in FIGS. 6A and 6C, each of the lead terminals 36 has a wide part at an end thereof, which is to be inserted into the storage space 32b. While FIGS. 6A and 6C illustrate an example in which the wide parts are formed in the planar direction, the wide parts may be formed in the cross-sectional direction. As illustrated in FIG. 6B, each of the molding members 52 has a tapering sloping surface 52a at an end thereof, which is not to be connected to the linkage member 51. While FIG. 6B illustrates an example in which the sloping surfaces 52a are formed in the planar direction, the sloping surfaces 52a may be formed in the cross-sectional direction. Shaping the lead part 50 in this way makes the lead terminals 36 hard to be pulled out of the frame body 31 and makes the molding members 52 easy to be pulled out of the frame body 31.

While not illustrated, for the lead terminals 33 to 35 whose ends are attached in the first lead region 32c of the frame body 31, a different lead part including the lead terminals 33 to 35 arranged in a line is prepared, and an end of each of the lead terminals 33 to 35 is linked and connected to a linkage member. On a side near the first lead region 32c, air vents for discharging gas from the storage space 3d may additionally be formed. In this case, a different lead part including molding members 52 corresponding to the air vents and the lead terminals 33 to 35, all of which are arranged in a line, is prepared. Ends of the molding member 52 and the lead terminals 33 to 35 are linked and connected to a linkage member.

Next, the above lead part 50 and the different lead part are set in a case mold that defines the outer shape of the frame body 31, and liquefied molding material is injected into the case mold until the case mold is filled with the liquefied molding material. After the injected molding material is hardened, the case mold is separated. This forms the frame body 31 having the storage opening part 32a at its back surface and the storage space 32b extending from the storage opening part 32a to the front surface of the frame body 31. In addition, since steps are formed in the storage space 32b, the frame body 31 also includes step surfaces in the first lead region 32c and the second lead region 32d. In addition, as illustrated in FIG. 6C, the lead part 50 is integrated with the frame body 31. The different lead part is also integrated with the frame body 31 on the opposite side of the lead part 50. Next, the linkage member 51 is separated from the lead part 50 integrated with the frame body 31. In this way, the lead terminals 36 and the molding members 52 are individually bonded to the frame body 31. Next, as illustrated in FIG. 7A, all the molding members 52 are pulled out. If mold release agent is applied to the molding members 52 or the molding members 52 have the sloping surfaces 52a, the molding members 52 are easily pulled out of the frame body 31. After the molding members 52 are pulled out, as illustrated in FIG. 7B, openings corresponding to the cross-sectional shapes of the molding members 52 are formed in the frame body 31. The gates 38 are consequently formed.

The semiconductor unit 20 formed in advance is attached in the storage opening part 32a of the resin case 30 formed as described above from the back surface via the adhesive agent 26, with the front surface of the semiconductor unit 20 on which the first semiconductor chips 21 and the second semiconductor chips 22 are mounted facing the storage space 32b. In this way, the first semiconductor chips 21 and the second semiconductor chips 22 of the semiconductor unit 20 are stored in the storage space 32b. In addition, the storage opening part 32a is covered by the semiconductor unit 20. In addition, the first semiconductor chips 21, the second semiconductor chips 22, the lead terminals 33 to 35, and the control ICs 37 in the first lead region 32c and the lead terminals 36 in the second lead region 32d are electrically connected via wiring members such as wires (whose reference characters are omitted).

Figure 8:
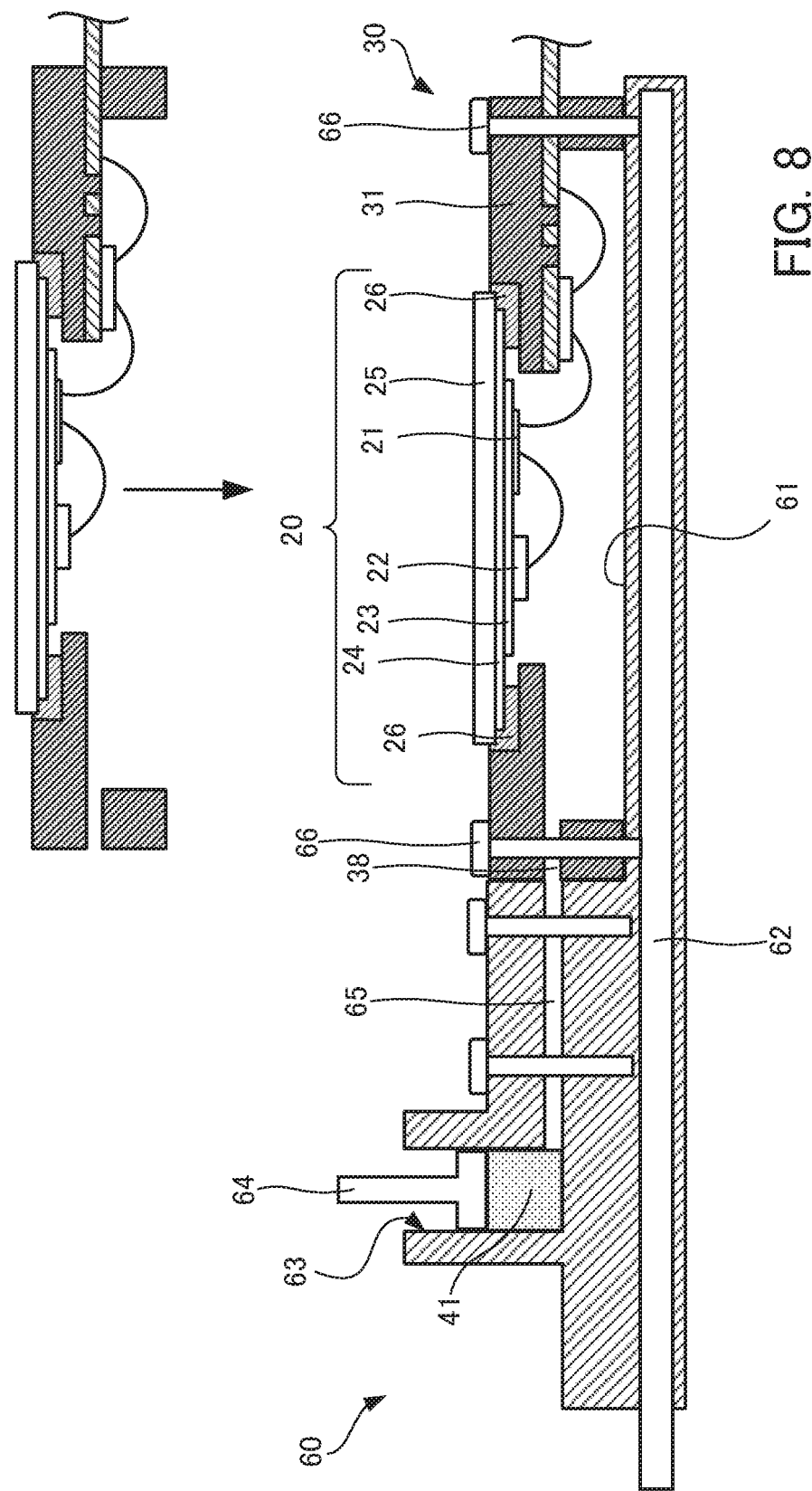
FIG. 8 is a first diagram illustrating a sealing step in the manufacturing method of the semiconductor device according to the second embodiment.
Figure 9:
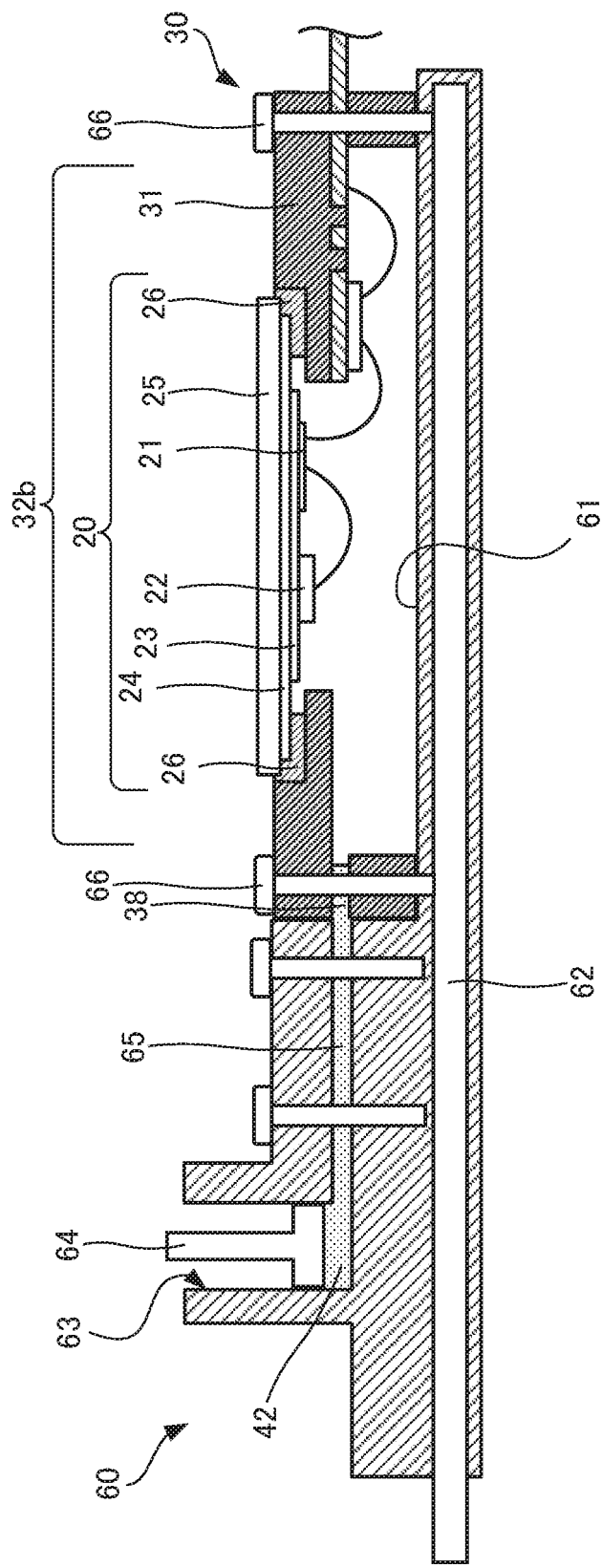
FIG. 9 is a second diagram illustrating the sealing step in the manufacturing method of the semiconductor device according to the second embodiment.

Next, a sealing step performed on the resin case 30 in which the semiconductor unit 20 has been attached will be described with reference to FIGS. 8 and 9. FIGS. 8 and 9 illustrate a sealing step in the semiconductor device manufacturing method according to the second embodiment.

A sealing apparatus 60 that performs the sealing step includes at least a mounting surface 61, a heater 62, a pot 63, a plunger 64, and runners 65. The sealing target resin case 30 in which the semiconductor unit 20 has been attached is arranged on the mounting surface 61. More specifically, as illustrated in FIG. 8, the resin case 30 is arranged on the mounting surface 61, with the front surfaces of the first semiconductor chips 21 and the second semiconductor chips 22 facing the mounting surface 61. The resin case 30 is fixed on the mounting surface 61 by fixing members 66. As illustrated in FIGS. 8 and 9, the fixing members 66 may be screws or the like. Alternatively, this fixing may be achieved by a press mold that presses the resin case 30 and the semiconductor unit 20 in the directions of the mounting surface 61 and the runners 65. When the resin case 30 is set on the mounting surface 61 as described above, the gates 38 of the resin case 30 are positioned at the respective runners 65.

The heater 62 is arranged under the mounting surface 61 and maintains the temperature of the pot 63 and the runners 65 at a certain temperature. This heater 62 prevents hardening of the softened sealing material supplied from tablet resin 41. Before the sealing step is performed, the tablet resin 41 is set in the pot 63. When the sealing step is performed, sealing material softened from the tablet resin 41 is stored. A lower part of the pot 63 is connected to the runners 65. The plunger 64 is set in an opening of the pot 63, and when the plunger 64 is pressed, the plunger 64 supplies the soften sealing material in the pot 63 to the runners 65. The runners 65 are arranged to correspond to the respective gates 38 of the resin case 30 mounted on the mounting surface 61. The sealing material pressed by the plunger 64 flows into these runners 65 from the pot 63. The runners 65 supply the flowing sealing material into the respective gates 38 of the resin case 30 mounted on the mounting surface 61.

As described above, first, the tablet resin 41 is set in the pot 63 of the sealing apparatus 60. The resin case 30 in which the semiconductor unit 20 has been attached is arranged on the mounting surface 61, with the first semiconductor chips 21 and the second semiconductor chips 22 facing the mounting surface 61. Next, the resin case 30 and the mounting surface 61 are fixed to each other with the fixing members 66. Next, by turning on the heater 62, the tablet resin 41 in the pot 63 is softened, and the softened sealing material is stored in the pot 63. Next, as illustrated in FIG. 9, when the plunger 64 is pressed, the sealing material 42 in the pot 63 flows through the runners 65 and the gates 38 of the resin case 30. Consequently, the storage space 32b in the resin case 30 is filled with the sealing material 42. When the sealing material 42 supplied in this way in the storage space 32b and the gates 38 of the resin case 30 hardens as the sealing material 40, the semiconductor device 10 illustrated in FIGS. 2 to 5 is obtained from the sealing apparatus 60.

In this manufacturing method of the semiconductor device 10, the frame body 31 of the resin case 30 surrounds the storage space 32b in which the first semiconductor chips 21 and the second semiconductor chips 22 are stored and has a side wall in which the gates 38 extending from the storage space 32b to the external space are formed. By attaching the semiconductor unit 20 in the storage opening part 32a of the resin case 30, storing the first semiconductor chips 21 and the second semiconductor chips 22 in the storage space 32b, and simply injecting the softened sealing material 42 via the gates 38, the storage space 32b and the gates 38 are sealed by the hardened sealing material 40. Thus, since the kind of the sealing material 40 is not limited to any particular kind and since a large-scale and precise mold is not needed to achieve sealing, reduction of the manufacturing cost is achieved. For example, even if tablet resin 41 having high moisture resistance is used as the sealing material 40, since there is no need to perform transfer molding using a large-scale and precise mold, the semiconductor device 10 having high moisture resistance is obtained easily with less manufacturing cost.

In addition, as described above, since the kind of the sealing material 40 in the semiconductor device 10 manufactured in the above way is not limited to any particular kind, properties such as the moisture resistance are improved depending on the sealing material 40. In addition, the sealing material 40 in the semiconductor device 10 seals not only the storage space 32b but also the gates 38. Thus, the sealing material 40 firmly seals the semiconductor device 10.

In addition, as illustrated in FIGS. 8 and 9, after the front surfaces of the first semiconductor chips 21 and the second semiconductor chips 22 are arranged to face the mounting surface 61, the sealing step is performed on the semiconductor device 10. Thus, the semiconductor device 10 is formed to have a flat front surface, and a marble pattern or air bubble marks are not formed. Thus, the semiconductor device 10 has improved outer appearance, and a seal such as a marking code is made on the front surface without fail.

According to the embodiments discussed, semiconductor devices are manufactured easily with less manufacturing cost.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:
    preparing a substrate having a main surface on which a semiconductor chip is disposed, and a resin case having a storage space therein, and a side wall, the side wall of the resin case having a straight injection path extending from the storage space to a device exterior, the resin case having a first opening at a bottom side thereof, connecting the storage space to the device exterior;
    attaching the substrate at a main surface side to the resin case at the bottom side so as to store the semiconductor chip in the storage space; and
    injecting a sealing material into the storage space via the injection path to seal the storage space, wherein
    the injection path is formed in the side wall of the resin case in a direction parallel to the main surface so that opposite ends of the injection path are positioned at a same height from a bottom of the resin case, and
    the resin case has a step formed along an outer periphery of the first opening, a surface of the step having a lead region, the injection path being formed at a same level as the lead region in the resin case.

2. The semiconductor device manufacturing method according to claim 1, wherein
    the attaching the substrate to the resin case includes attaching the substrate to a substrate bonding area of the resin case, the substrate bonding area being formed by an area inside the step in a plan view of the semiconductor device.

3. The semiconductor device manufacturing method according to claim 1, wherein the preparing the resin case includes:
    injecting a molding material constituting the resin case into a case mold that defines an outer shape of the resin case, the case mold including a rod-shaped molding member for forming the injection path;
    hardening the molding material;
    separating the hardened molding material from the case mold; and
    pulling out the molding member from the hardened molding material, thereby to form the resin case with the injection path.

4. The semiconductor device manufacturing method according to claim 3, wherein the resin case further includes an external connection terminal having two ends, and penetrating the side wall so that one of the two ends is located in the storage space and the other one of the two ends is located in the device exterior.

5. The semiconductor device manufacturing method according to claim 2, wherein the lead region located on the surface of the step in a portion of the side wall at a side opposite to a side of a portion of the side wall in which the injection path is formed.

6. A semiconductor device manufacturing method, comprising:
    preparing a substrate having a main surface on which a semiconductor chip is disposed, and a resin case having a storage space therein, and a side wall, the side wall of the resin case having an injection path extending from the storage space to a device exterior, the resin case having a first opening at a bottom side thereof, connecting the storage space to the device exterior;
    attaching the substrate at a main surface side to the resin case at the bottom side so as to store the semiconductor chip in the storage space; and
    injecting a sealing material into the storage space via the injection path to seal the storage space, wherein
    the resin case further includes an external connection terminal having two ends, and penetrating the side wall so that one of the two ends is located in the storage space and the other one of the two ends is located in the device exterior,
    the preparing the resin case includes:
        injecting a molding material constituting the resin case into a case mold that defines an outer shape of the resin case, the case mold including a rod-shaped molding member for forming the injection path and a linkage member connecting the molding member and the external connection terminal in one piece, so that the molding member and the external connection terminal are integrated with the resin case;
        hardening the molding material;
        separating the hardened molding material from the case mold; and
        extracting the resin case, and the molding member and the external connection terminal that are integrated with the resin case, from the case mold;
        cutting off the linkage member from the molding member and the external connection terminal; and
        pulling out the molding member from the hardened molding material, thereby to form the resin case with the injection path and the external connection terminal.

7. A semiconductor device manufacturing method, comprising:
    preparing a substrate having a main surface on which a semiconductor chip is disposed, a resin case having a storage space and a side wall, the side wall of the resin case having a straight injection path extending from the storage space to a device exterior, the resin case having a first opening at a bottom side thereof, connecting the storage space to the device exterior;
    attaching the substrate at a main surface side to the resin case at the bottom side so as to store the semiconductor chip in the storage space; and
    injecting a sealing material into the storage space via the injection path to seal the storage space, wherein
    the injection path is formed in the side wall of the resin case in a direction parallel to the main surface so that opposite ends of the injection path are positioned at a same height relative to a bottom of the resin case, the resin case has a second opening at a top side opposite to the bottom side, connecting the storage space to the device exterior, the injecting a sealing material into the storage space includes covering the second opening from the top side of the resin case by a mold while the sealing material is injected, and the injecting a sealing material into the storage space further includes setting the resin case with the second opening, which is covered with the mold, facing downward and the bottom side, to which the substrate is attached, facing upward while the sealing material is injected.

* * * * *